United States Patent [19]

Robinson et al.

[11] 4,388,560

[45] Jun. 14, 1983

[54] FILAMENT DISPENSER CATHODE

[75] Inventors: William P. Robinson, Newbury Park; Hugh McNulty, Jr., Santa Monica; Robert L. Seliger, Agoura; Weldon S. Williamson, Malibu, all of Calif.

[73] Assignee: Hughes Aircraft Company, El Segundo, Calif.

[21] Appl. No.: 266,772

[22] Filed: May 26, 1981

[51] Int. Cl.³ .......................... H01J 3/04; H01J 27/26
[52] U.S. Cl. ........................... 315/111.81; 250/423 R; 313/146; 315/357
[58] Field of Search ...................... 315/111.81, 111.91, 315/357; 313/146, 151, 152, 236, 362, 363, 459; 250/423 R, 427

[56] References Cited

U.S. PATENT DOCUMENTS 3,290,540 12/1966 Atti ...................................... 313/146

FOREIGN PATENT DOCUMENTS 54-105699 8/1979 Japan ................................. 313/146

Primary Examiner—Eugene R. LaRoche
Attorney, Agent, or Firm—A. A. Dicke, Jr.; W. J. Bethurum; Karambelas A. W.

[57] ABSTRACT

Thermionic cathode 12 for a plasma ion source 10 has tungsten wire 64 advanced by wheels 56 from supply 50 to take-up spool 58. In chamber 48, the active cathode region 64 acts with anode 16 to supply electrons for ionizing a fuel gas so the ions are discharged from slit 18 for acceleration, separation and implantation.

12 Claims, 5 Drawing Figures

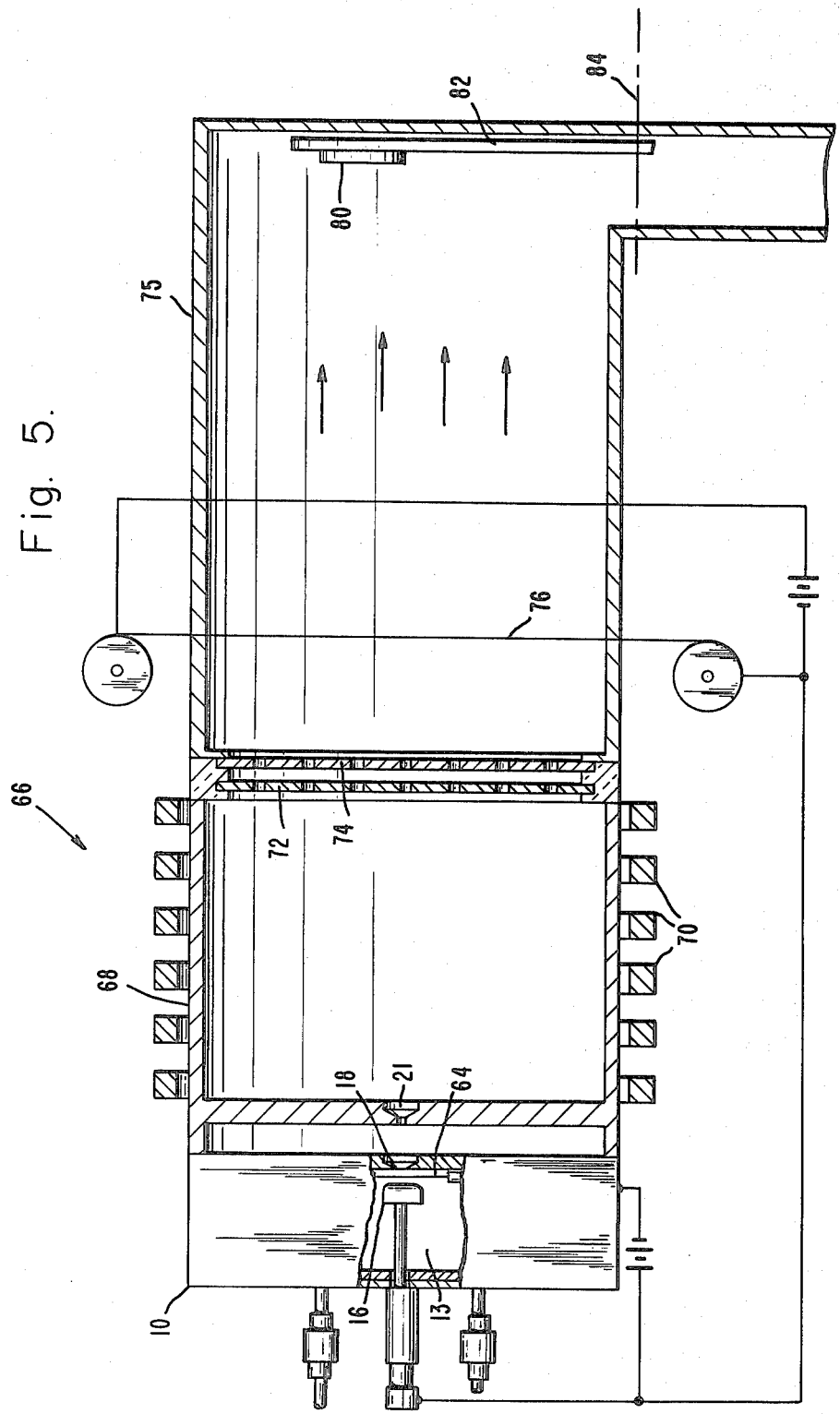

FILAMENT DISPENSER CATHODE

BACKGROUND OF THE INVENTION

This invention is directed to a filament dispenser cathode which has an exceptionally long life in a plasma discharge accomplished by drawing a filament of emissive material through the discharge chamber.

The cold cathode ion sources of the prior art are disadvantaged by the fact that they require high discharge voltage which causes the ions to be generated with a large energy spread. The fixed filament hot cathode sources of the prior art require large heater current and have only a short life. A hot filament discharge is well known for versatility in operation with many gases. But it is particularly difficult to provide a good life in such an ion source when the hot filament must operate with corrosive gas. Furthermore, it is desirable for its low energy spread which enables good beam formation. However, the short filament lifetime has been a major drawback which prevented the use of a hot filament ion source in production systems. Accordingly, there is need for a long life hot filament ion source.

SUMMARY OF THE INVENTION

In order to aid in the understanding of this invention, it can be stated essentially summary form that it is directed to a filament dispenser cathode. A supply of cathode material in filament form is pulled from a supply through an active area and collected. It is moved at a sufficient rate that filament material lost in the discharge does not unduly reduce the filament strength.

It is thus a purpose and advantage of this invention to provide a cathode which has a long life by having a cathode material continuously refreshed by advancing of filament. It is another object to provide a long life cathode, particularly for hot filament ion sources so that the hot filament can operate for a long life even at relatively high current and in a corrosive environment.

Other purposes and advantages of this invention will become apparent from the study of the following portion of this specification, the claims and the attached drawings.

BRIEF DESCRIPTION OF THE DRAWINGS

FIG. 5 is a generally centerline section through an ion system employing the filament dispenser cathode of this invention for the production of a discharged plasma to produce a space-charged neutral reactive ion beam for ion machining and the like.

DESCRIPTION OF THE PREFERRED EMBODIMENT

Figure 1:
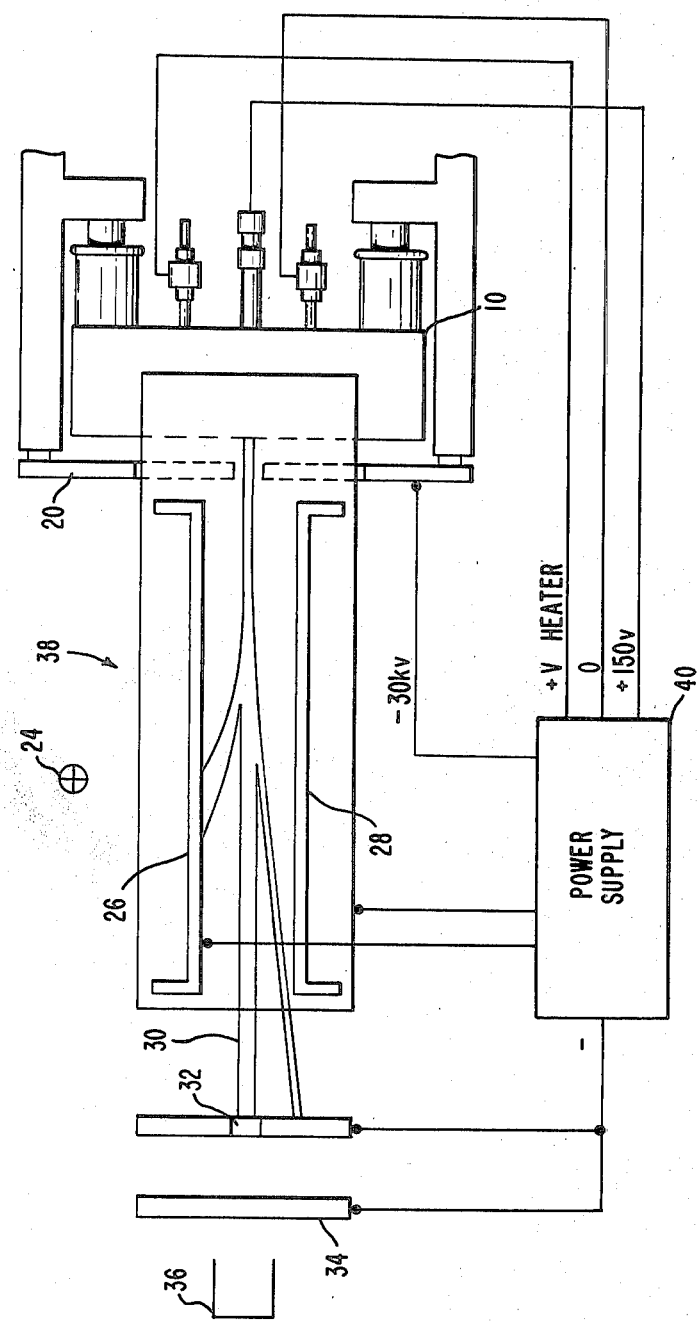
FIG. 1 is a schematic plan view of the filament dispenser cathode of this invention shown in association with an ion mass separator and target.

FIGS. 1, 2, 4 and 5 illustrate ion source 10 which contains the filament dispenser cathode 12 of this invention. In FIG. 3, cathode 12 extends perpendicular to the paper, in housing 13 is supplied with feed gas for ionization through supply pipe 14 which supplies the gas past anode 16 and cathode 12. Anode 16 is mounted on posts 15, see FIGS. 2 and 3, each of which are mounted in a cap 17 which is carried on housing 13 through an insulator.

Electrons passing between the cathode 12 and anode 16 cause ionization of the feed gas. The ionized particles comprise a plasma at slit 18, which extends perpendicular to the paper in FIGS. 1 and 2. The ions are extracted and accelerated by extractor electrode 20, which has a parallel slit 21 to produce ribbon ion beam 22, of FIG. 1, which has its width perpendicular to the paper in FIGS. 1 and 2. The entire sturcture is immersed in a magnetic field indicated by magnetic field arrow 24. Electric field plates 26 and 28 are positioned parallel to the path of the ribbon beam and have potential applied thereto so that in the presence of the magnetic field, the desired ion species passes along a selected path 30. The path may be straight, as shown, or curved, depending on magnetic and electric field strength. Mass separator slit 32 is positioned along the path and is sized so that unwanted species do not pass through slit 32. Target wafer 34 is positioned beyond the mass separator slit 32 so that the desired species is implanted into the target wafer. Faraday cup 36 is positioned beyond the wafer so that the beam current can be measured when the wafer is taken away.

Power supply 40 is connected to the various parts of the system to provide the necessary potentials. It is understood that the ion utilization system 38 is schematic in showing. The ion utilization system 38 provides an example of how the ions produced by source chamber 13 can be utilized. In the example of FIG. 1, the ion utilization system 38 can alternatively employ an electric field plate system which has a focusing feature for aiding and focusing the desired species. Furthermore, various wafer handling devices can be employed. Additionally, a curved path for the selected ions can be employed so that neutral particles are also separated.

Figure 2:
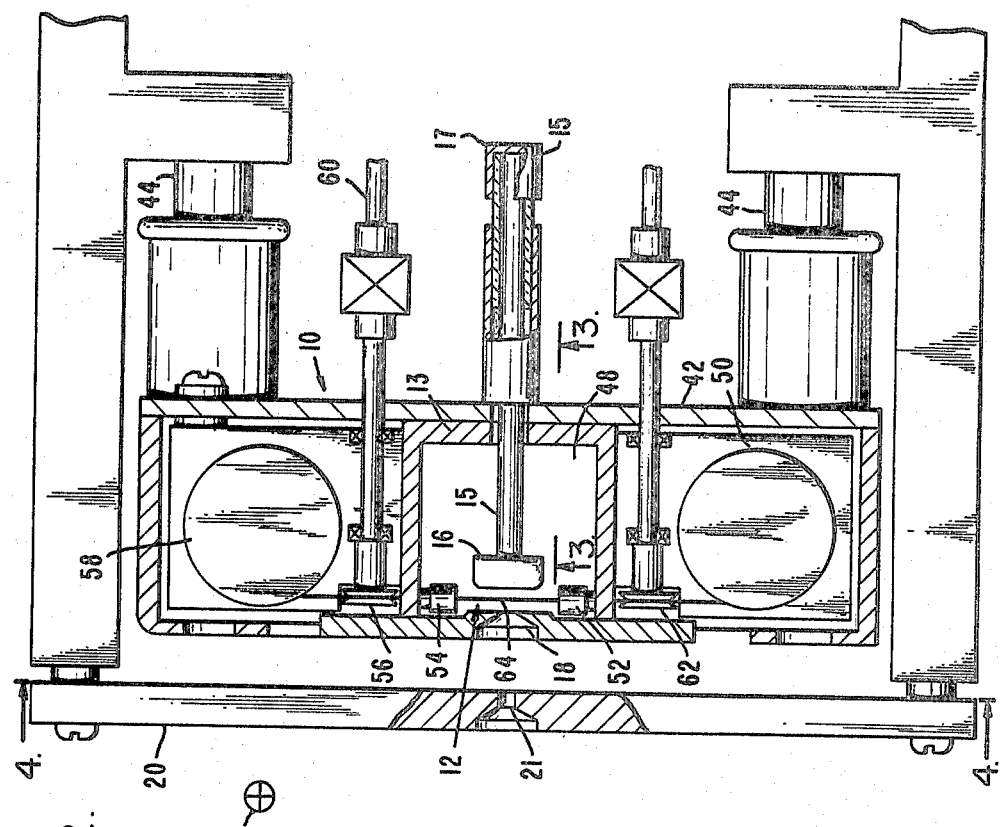
FIG. 2 is an enlarged plan view, with parts broken away and parts taken in section of the ion source portion with the filament dispenser cathode of this invention.
Figure 3:
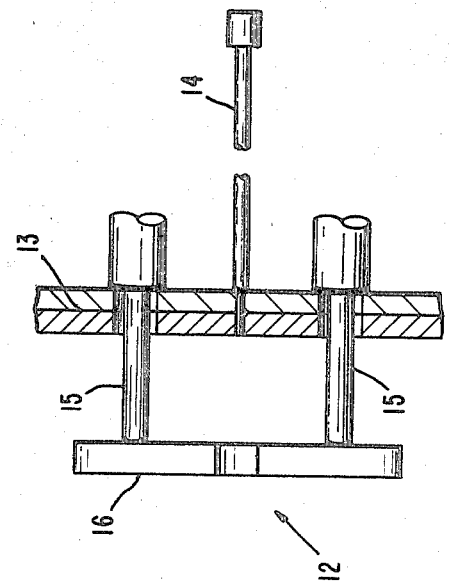
FIG. 3 is a section taken generally along line 3—3 of FIG. 2, with parts broken away, showing the anode support and the feed gas supply structure.
Figure 4:
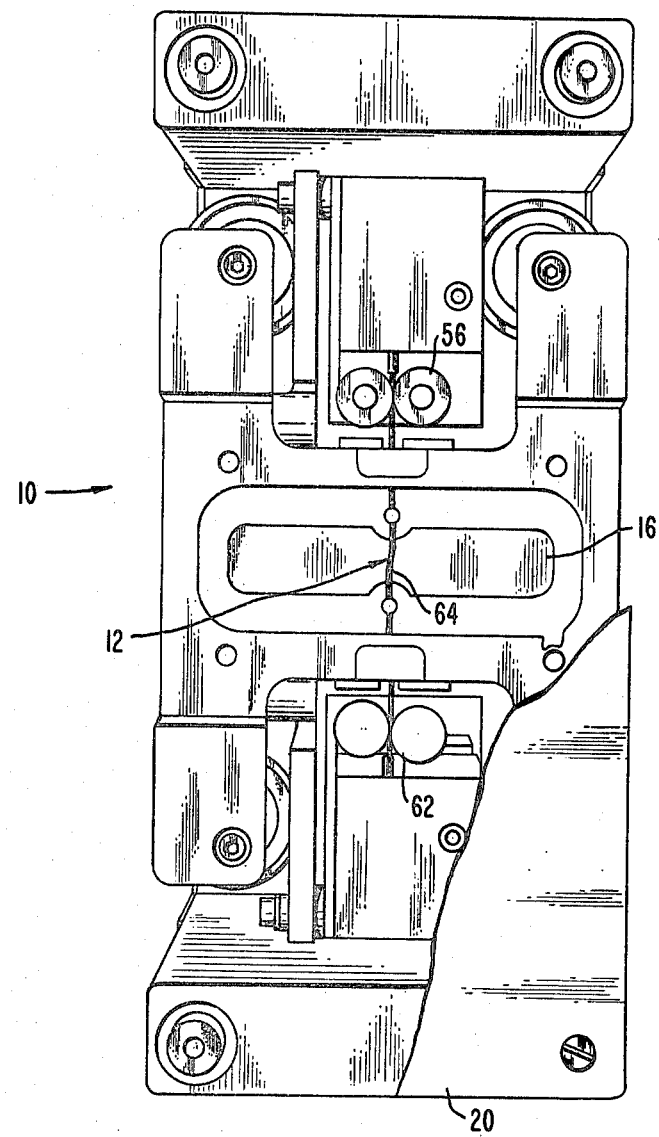
FIG. 4 is a perpective view of the front of the ion source structure, as seen generally along lines 4—4 of FIG. 2.

As seen in FIGS. 2 and 3, ion source 10 comprises housing 42 mounted on a set of insulators 44 so that the housing 42 can be at a different potential than extractor electrode 20. Housing 42 is at the cathode potential. Anode posts 15 support anode 16. Supply pipe 14 supplies the feed gas to the interior source chamber 48. The anode post 15 passes through an insulator bushing and is connected to power supply 40 to provide the anode potential.

The cathode 12 is in the form of a wire which is provided from supply coil 50, which may be in the form of a spool. The cathode wire passes between tension wheels 62 and then through insulator busings 52 and 54 which limit the active length of the wire in the plasma. Take-up wheels 56 engage the wire therebetween and advance the cathode wire to spool 58 where the used wire is wound up. Take-up wheels 56 are driven at a controllable speed by a motor connected to drive shaft 60. During its advance, the wire passes between the tension wheels 62 which serve as wire straightener wheels, tension wheels for the active portion 64 of the cathode between insulators 52 and 54, and as electrical contact with the wire. As indicated in FIG. 1, the wheels 62 and 54 are connected to the power supply so that the heating current passes through the wheels to the filament wire to heat the portion thereof between the sets of wheels. Thus, the active portion 64 between the insulators is heated.

Tungsten is considered to be the preferable cathode wire material. In the preferred embodiment the wire has a 0.015 inch diameter and has a ½ inch heated length between the insulators. This provides sufficient surface area at about 2000° K. emission temperature for 1 ampere discharge in the ion source between the cathode and anode when the system is fueled with boron trifluoride or 0.3 amperes of discharge when arsenic is used as a fuel.

When the active portion 64 of the filament 12, that is the portion between insulator bushings 52 and 54, is heated and a discharge voltage is applied between that strip of filamentry cathode and the anode 16, a glow discharge takes place therebetween in the feed gas supplied into that space by pipe 14. A magnetic field 24 is present to cause the elongation of electron path so that ionization takes place. The resultant ions are accelerated out of slits 18 and 21 and can be employed for several different purposes, for example, those illustrated in FIGS. 1 and 5.

It is important and critical that the distance between the active portion of the wire and the front of anode 16 is about 5 cyclotron radii. When the distance is less than 5 cyclotron radii, low ionization efficiency results. When the distance is more than 5 cyclotron radii, the ionization reaction becomes space-charge limited.

In an environment as illustrated, the active portion 64 of the cathode wire is subjected to sputtering. FIG. 5 shows an embodiment where a space-charge-neutral reactive ion beam is employed for ion machining. The sputtering causes higher local heating to result in more tungsten evaporation. The resultant smaller wire causes higher IR drop to further increase the local heating. Sputtering loss in the disclosed structure causes a diameter reduction of about 0.0005 inches per hour on a 0.015 inch tungsten wire. To overcome this loss, the cathode wire is transported forward. Under the conditions indicated, a wire advance rate of about 1 inch per hour prevents wear-out due to evaporation and sputtering. Enough wire remains so it can be pulled forward, and the used wire can be stored as waste in a waste storage region. As a result, a long life cathode is provided, limited only by the length of the wire supply on coil 50.

For example, when the supply of gas to supply pipe 14 is boron trifluoride, the resultant primary ionization products are $B_{(10)}^+$, $B_{(11)}^+$, $F^+$, $BF^+$, $BF_2^+$, $BF_3^+$. When arsenic is used as a supply gas, the ionized product contains $As_4^+$, $As_3^+$, $As_2^+$ and $As^+$. The arsenic species are much heavier than the boron and fluoride species and thus cause much more sputtering.

FIG. 5 illustrates ion source assembly 66 which provides a neutralized ion beam for utilization in ion machining. The filament chamber 13 is the same as the filament chamber described in connection with FIGS. 2 and 4. A filament wire 12 is pulled from a supply spool 50 by a take-up spool 58. The electrical contacts with the active portion 64 of the filament wire 12 are shown as rubbing contacts, but they are preferably wire take-up and guide wheels as shown in FIG. 2.

The ion source 10 is connected to discharge chamber 68 which is provided with multiple magnetic field loops by a plurality of circular magnets 70. At the outlet of discharge chamber 68 is screen electrode 72, which is at chamber potential. This structure produces a Penning discharge in the plasma space within the chamber. Ions drift from the plasma in the chamber through screen electrode 72. Beyond the screen electrode is positioned the accelerator electrode 74 which is negatively charged to provide acceleration to the ions drifting from the chamber. Thus, the ions are accelerated into the target chamber 75.

Neutralizer filament 76 is an electron emitting filament. It is heated by the application of a heater potential across the filament. Within the ion stream, the neutralizer filament is subject to erosion from ion bombardment, and thus it is structured so that it can be advanced through target chamber 75, to remove the eroded filament material before mechanical failure occurs. A tungsten wire provides electrons which neutralize the ions so that within the target chamber to the right of the neutralizer filament, the beam is a space-charge neutral ion beam of reactive ions. Since the beam is space-charge neutral, it is not subjected to the spreading forces which are present in beams of particles having charges. In this way, the particle beam approaching target 80 is parallel and the target can be ion beam machined without undercutting of the target material. Target 80 is mounted on a target wheel 82 which revolves on axis 84. This brings targets through the beam for uniform exposure by the space-charge neutral reactive ion beam. If desired, the target chamber can be provided with a convenient structure for the changing of the target material.

This invention has been described in its presently contemplated best mode and it is clear that it is susceptible to numerous modifications, modes and embodiments within the ability of those skilled in the art and without the exerise of the inventive faculty. Accordingly, the scope of this invention is defined by the scope of the following claims.

What is claimed is:
1. A discharge chamber;
   an ion source within said discharge chamber, said ion source comprising:
   a housing;
   an anode within said housing;
   an ion outlet opening from said housing;
   supply means for supplying ion fuel feed gas to said housing;
   a cathode positioned between said anode and said ion outlet opening from said housing, said cathode comprising an elongated metallic coil strip;
   drive means comprising a pair of motor driven take-up wheels engaged with said strip for advancing said strip from a source to a separate waste region by applying advancing force separately from said source and waste region for advancing said strip;
   a Penning discharge chamber connected to said ion outlet opening from said housing to receive ionized feed gas therein, said Penning discharge chamber having an anode surrounding said chamber, and having a screen outlet, an accelerator electrode positioned beyond said screen electrode to accelerate ions from said Penning plasma discharge chamber to produce an ion stream; and
   a target chamber connected to receive accelerated ions form said accelerator electrode, and to contain a target therein for bombardment from said accelerated ion stream.

2. The combination of claim 1 further including a neutralizing cathode in the accelerated ion stream to substantially neutralize the ions in the stream to provide a substantially neutralized accelerated reactive ion stream for discharge onto a target.

3. The combination of claim 2 wherein there is a filament extending through said target chamber, together with means for heating said filament and means for advancing said filament.

4. The ion source of claim 1 wherein said pair of take-up wheels is geared together and being connected to be motor driven.

5. The ion source of claim 4 wherein said strip is spaced from said anode substantially about 5 cyclotron radii.

6. The ion source of claim 1 wherein said strip is spaced from said anode substantially about 5 cyclotron radii.

7. The ion source of claim 1 wherein said strip is supplied from a coil and is delivered by said strip advancing means to a waste chamber, a portion of said strip forming an active cathode, said active cathode portion being positioned in a chamber with said anode, said exit slit forming an ion exit from said chamber, a first insulator surrounding said strip as it enters said chamber and a second insulator surrounding said strip where it leaves said chamber so that the active electron emissive portion of said strip is positioned between said insulators, said motor driven take-up wheels being positioned between said second insulator and said waste chamber.

8. The ion source of claim 7 wherein tension wheels engage said strip between said supply and said active region and said take-up wheels engage said strip between said active region and said waste chamber, said take-up wheels being conected to be driven to advance said strip so that said take-up wheels are a portion of said means for advancing said strip.

9. The ion source of claim 8 wherein said strip is an electrically conductive wire.

10. The ion source of claim 9 wherein said strip is spaced from said anode substantially about 5 cyclotron radii.

11. The ion source of claim 9 further including ion optics means for accelerating the ion beam issuing from said chamber slit and for separating from the ion beam the selected species.

12. An electron source comprising:
a discharge chamber;
an anode within said discharge chamber;
an accelerator electrode forming a wall of said discharge chamber and having a charged particle opening therethrough; and
a cathode positioned between said anode and said opening so that when said cathode is heated and a potential is applied between said anode, said cathode and said accelerator electrode, charged particles can be accelerated through said opening, said cathode comprising an elongated strip of metal from which electrons can be extracted, a strip supply coil from which said strip of metal is delivered and a waste chamber to which said strip is delivered, a first insulator surrounding said strip as it enters said discharge chamber and a second insulator surrounding said strip where it leaves said discharge chamber to define an active electron emissive portion of said strip between said insulators, first and second pairs of electric contact wheels engaging said elongated strip opposite said opening and beyond said insulators with respect to said opening so as to provide a heating current path through said strip between said contact wheels, motor means connected at least to said second pair of electric contact wheels to advance said strip as material is depleted therefrom.

* * * * *